United States Patent [19]

Hanajima et al.

[11] Patent Number: 4,503,471
[45] Date of Patent: Mar. 5, 1985

[54] CONTROL ARRANGEMENT FOR ELECTRONIC APPLIANCE

[75] Inventors: Mitsuru Hanajima, Hoya; Yoshinori Yamamoto; Yasushi Matsumoto, both of Yokohama, all of Japan

[73] Assignee: Sony Corporation, Tokyo, Japan

[21] Appl. No.: 422,567

[22] Filed: Sep. 24, 1982

[30] Foreign Application Priority Data

Oct. 8, 1981 [JP] Japan ................. 56-160478

[51] Int. Cl.³ ............................................. G11B 27/24
[52] U.S. Cl. ........................................ 360/69; 360/65;
360/66; 360/67; 360/137; 340/789; 340/798;
340/800
[58] Field of Search ............... 364/140, 141, 146, 188,
364/189, 200 MS File, 900 MS File; 360/137,
14, 72.2, 72.3, 74.1, 72.1, 69, 65, 66, 67;
340/716, 798, 789, 799, 800, 803; 369/30, 31, 32

[56] References Cited

U.S. PATENT DOCUMENTS

| 4,279,012 | 7/1981 | Beckedorff et al. ............... 364/146 |
| 4,302,784 | 11/1981 | Mussatt ............................. 360/72.3 |
| 4,322,814 | 3/1982 | Menezes et al. ................... 360/14 |
| 4,338,644 | 7/1982 | Staar .................................. 360/69 |
| 4,371,922 | 2/1983 | Fujita et al. ....................... 364/146 |
| 4,399,527 | 8/1983 | Titus et al. ........................ 369/29 |
| 4,411,008 | 10/1983 | d'Alayer de Costemore d'Arc et al. ............................ 360/137 |
| 4,413,299 | 11/1983 | Sugiyama et al. ................ 360/137 |
| 4,413,328 | 11/1983 | Videki ............................... 360/69 |

Primary Examiner—Gareth D. Shaw
Assistant Examiner—Jameson Lee
Attorney, Agent, or Firm—Lewis H. Eslinger; Alvin Sinderbrand

[57] ABSTRACT

The operation of an electronic appliance, such as a cassette tape deck, is controlled completely or partially by switch operation. The appliance includes a memory for storage of control information, setting devices, such as switches, for entering the control information, a memory lock or latch for controlling the operating state of the appliance based on the control information supplied from the memory or from the setting devices to the memory lock, and for locking the appliance into such operating state, a display arrangement adapted for display of the setting information and for display of the information in the memory lock, and a setting change display indicator. The setting information stored in the memory can be checked by actuating a check switch, which causes the setting information stored in the memory to be displayed without affecting the operating state in which the appliance is locked. When the operating state is changed by a setting operation while the information previously stored in the memory has been transferred to the memory lock to control the operating state of the appliance, so that the contents of the memory lock (i.e., the operating state in which the appliance is locked) are not coincident with the corresponding information stored in the memory, the fact of such change is displayed on the setting change display indicator. This notifies an operator that the information is being changed, and assists the operator in avoiding unintentional errors.

11 Claims, 4 Drawing Figures

CONTROL ARRANGEMENT FOR ELECTRONIC APPLIANCE

BACKGROUND OF THE INVENTION

This invention relates to electronic appliances, for example, cassette tape decks, and is more particularly directed to electronic equipment components in which various modes of operation can be set by entering setting information on push buttons, touch switches, or other switches on an operating panel, after which the setting information is stored in a memory lock or latch and controls particular functional elements of the electronic equipment component. For example, in a cassette tape deck, such setting information can be entered and stored to control recording level, recording balance, and playback or output level.

Recently, improvements in performance and reductions in cost have been made possible by the use of digital integrated circuitry in domestic appliances, especially audio equipment. Marked advances made in recent years in digital and computer technology have permitted such digital circuitry to be used extensively to replace many expensive, cumbersome, and often unreliable mechanical and electromechanical components in these domestic appliances.

However, application of digital technology to a domestic appliance also gives rise to complexity of operation, which can lead to operator error. This problem is especially prevalent where the appliance is an article of taste, such as a cassette tape deck, and where the appliance has many diverse functions to be controlled by digital circuitry.

For example, in a digitally controlled cassette tape deck, various parameters such as recording level, output level, recording balance, tape type selection (i.e., normal, high-bias, chrome-oxide, etc.), and noise-reduction selection can be selected on touch switches or other like devices. This information is transmitted to a latch or memory lock, where it is used to control the elements associated with each of the above parameters. Preset setting information can also be stored in a digital memory to set each of the parameters to any of one or more preset arrangements, which can be changed to a preference state by use of the touch switches.

A display is associated with each of these parameters, i.e., recording level, output level, recording balance, tape type selection, and noise-reduction selection, and shows the contents of the memory lock or latch, that is, the values of the parameters actually in use.

With such an arrangement if a change is to be made in the preset state, the stored information in the memory has to be provided to the latch, so that the information can be displayed. Then the information is changed by means of the associated touch switches. If the actual setting for one of the parameters is changed when the preset information is read out from the memory, it often occurs that a consumer operator will erroneously change the preset information at the time that the operating parameter is changed to a preference level.

It is also confusing for a consumer to operate this type of appliance in that there is no simple means to check the information stored in the memory without disturbing the information stored in the latch. Further, there is no indication provided on the operating panel if any of the information furnished from the memory to the latch has been altered.

OBJECTS AND SUMMARY OF THE INVENTION

Accordingly, it is an object of the present invention to provide an electronic appliance that avoids the above-described disadvantages and difficulties of the prior art.

More particularly, it is an object of the present invention to provide an electronic appliance in which confirmation only of various stored information relating to settings of audio or other electronic appliances can be made easily, and in which, when any change has been made to the preset information, such change is displayed clearly to prevent operational errors and to simplify operation of the appliance.

It is another object of the present invention to provide an electronic appliance in which setting information may be displayed to permit a confirmation or check of the stored setting information without affecting the contents of the setting information when a particular selected operation is being carried out in the appliance, and in which, when a portion of an actual operation of the appliance is changed by actuating a selecting switch after the previously set information has been read out from a memory and the appliance has been activated into such actual operation, such setting change can be displayed clearly on setting change display means.

In accordance with one important aspect of the present invention, an electronic appliance has a plurality of elements which are selectively controlled in response to setting information, and includes a control panel having setting switches or other setting devices thereon, and display arrangements mounted thereon. Setting information is entered on the setting switches, and a latch or memory lock connected to the setting switches receives such setting information and sets each of the elements into a setting state as established by the setting information entered on the setting switches. The display arrangements are also coupled to the setting arrangements and are operative to display the setting information for each of the elements.

The improvements of this invention comprise a read switch, a write switch, a check switch, and memory means operative to receive and store the setting information contained in the latch upon actuation of the write switch and to cause the latch to receive and store the setting information contained in the memory means upon actuation of the read switch. The check switch is coupled to the memory means for causing the contents of the latter to be selectively displayed on the associated display arrangements, without disturbing the contents of the latch. A setting-change display indicator is associated with the display arrangements and the setting switches for displaying that the information corresponding to the setting of one of the elements has been altered after the information has been read out from the memory means and received in the latch.

The above and many other objects, features, and advantages of this invention will become apparent from the ensuing detailed description when considered in connection with the accompanying drawings which show an illustrative embodiment thereof.

DETAILED DESCRIPTION OF PREFERRED EMBODIMENT

Figure 1:
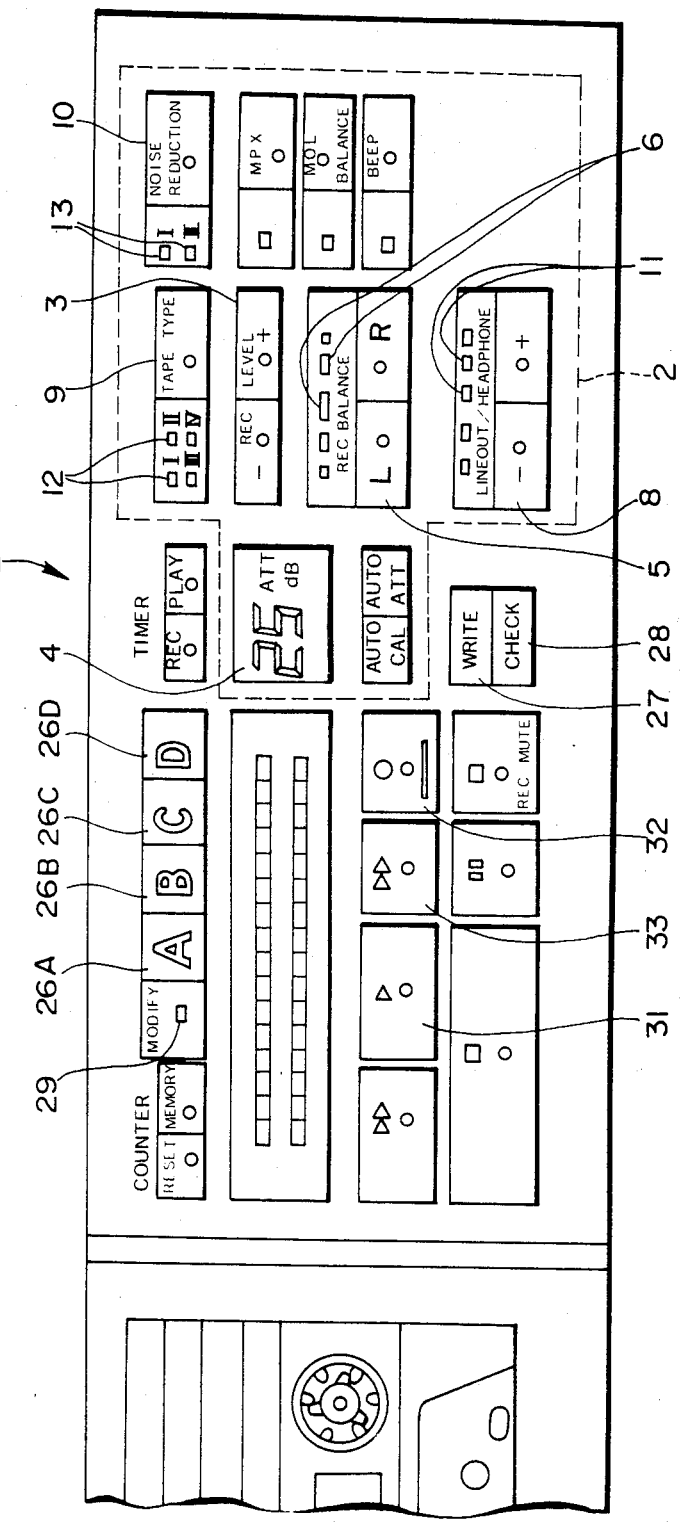
FIG. 1 is a front elevational view of a portion of an operating panel of a cassette tape deck according to one embodiment of this invention.

With reference to the accompanying drawings, and initially to FIG. 1 thereof, an audio casette tape recorder deck, i.e., a so-called cassette deck, will serve as an illustrative preferred embodiment of the present invention.

FIG. 1 shows an operating panel 1 of the cassette deck, in which a portion 2, defined by ghost lines, is a tape-deck setting or adjustment and display area. As typical of the functions to be set and displayed are recording level selection, recording balance selection, output level selection, tape sort or type selection, and noise-reduction (on/off) selection. In this embodiment, there are also provided multiplex filter or limiter on/off operation. The setting elements in this setting and display area 2 are favorably constituted by so-called touch switch type operating devices, including touch surfaces. The display portions corresponding thereto are provided in this area 2 in close proximity to the associated touch switches.

In this setting and display area 2 of the operating panel 1, a recording level setting section 3 has a plus (+) touch surface, a minus (−) touch surface, and a recording level display portion 4, here in the form of seven-segment decimal digits. The decimal figures displayed in the portion 4 can be incremented or decremented merely by touching the corresponding touch surfaces of the recording level setting section 3 lightly with the finger.

A recording balance setting section 5 has left (L) and right (R) touch surfaces, and has a recording balance display portion 6 in an upper portion thereof. This display portion 6 is favorably formed of a plurality of light emitting diodes (LEDs) arranged in a horizontal row.

An output level setting section 8, a tape-sort or tape-type selecting section 9, and a noise reduction on/off selecting section 10 are also provided with respective output level, tape sort, and noise reduction LED display portions 11, 12, and 13.

Figure 2:
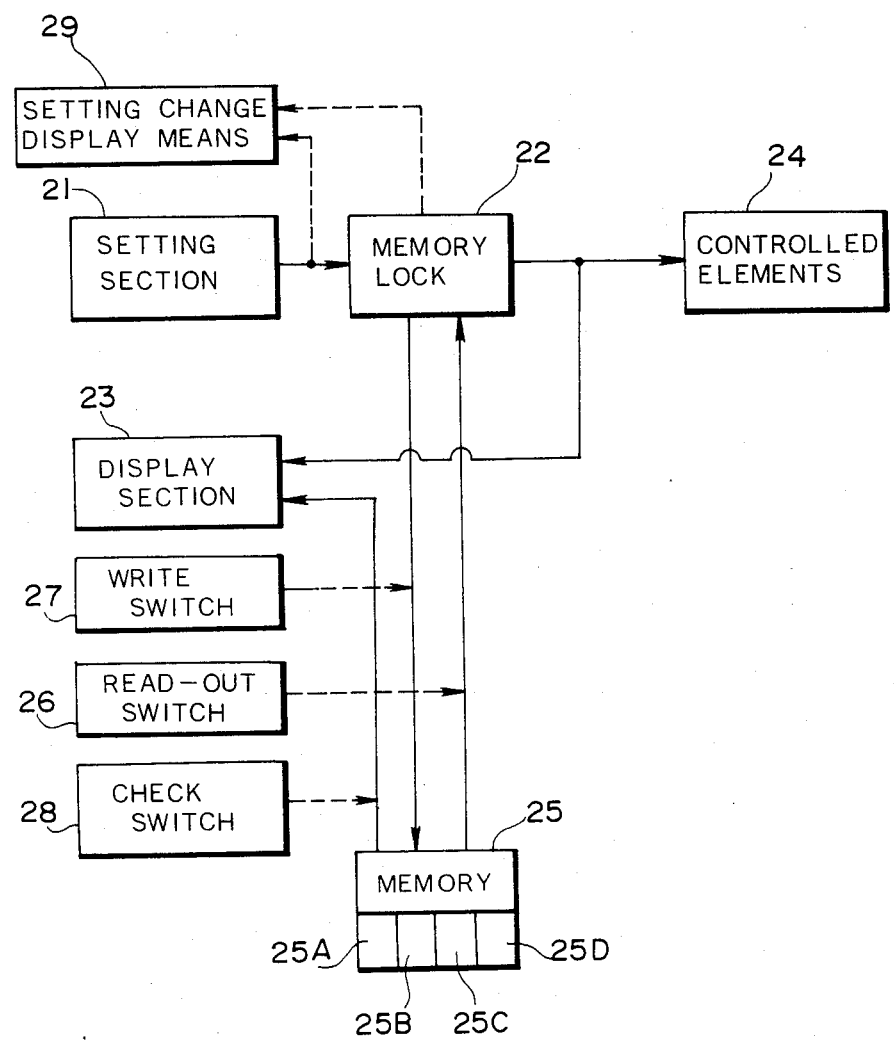
FIG. 2 is a block diagram schematically illustrating basic elements of this embodiment of the invention.

The general arrangement of the control circuitry for carrying out the setting and display of the functions of the cassette tape deck of this embodiment can be understood with reference to FIG. 2. Here a setting section 21, which corresponds to the recording level setting section 3, the recording balance setting section 5, the output level setting section 8, the tape sort selecting section 9, the noise-reduction selecting section 10, and any other setting sections included in the area 2 shown in FIG. 1, is electrically coupled to a memory lock or latch 22 which can be in the form of a random access memory (RAM), flip-flops, or a storage register. In this embodiment, the touch switches in the setting section 21 do not have a self-lock or self-hold function, as do mechanical switches, but are capable only of providing output pulses whenever actuated by a hand or finger touch to the associated touch surfaces. Hence, the memory lock 22 serves as a hold means whose contents are set or altered in accordance with actuation of the touch switches in the setting section 21.

Setting information entered on the touch switches of the setting section 21 and stored in the memory lock 22 is provided to a display section 23, which, in this embodiment, is constituted by the display portions 4, 6, 11, 12, and 13 of FIG. 1. The information stored in the memory lock 22 is also furnished to controlled elements 24, constituted by electronic switches or relays which can be turned on or off in response to the setting information stored in the memory lock 22. The display section 23 is thus driven by the information in the memory lock 22 to show the status of the controlled elements 24, thus corresponding to the various functional states of the tape cassette deck.

A memory device 25, which can favorably be formed as a RAM, is used for storage of preset information to be furnished to the memory lock 22. This memory device 25 is favorably constituted by a plurality of storage areas 25A to 25D, each of which is capable of storing the setting information for each of the functions set and displayed in the setting and display area 2 on the operating panel 1 shown in FIG. 1. In this embodiment, the memory 25 contains four such storage locations 25A, 25B, 25C, and 25D, and a plurality of hand or finger touch switches 26A, 26B, 26C, and 26D (FIG. 1) are provided on the operating panel 1 to cause the setting information stored in a respective one of the memory locations 25A to 25D to be provided to the memory lock 22. In FIG. 2, a readout switch 26 represents these touch switches 26A to 26D.

When an operator touches the surface of one of these switches 26A to 26D, a corresponding data word A, B, C, or D is read out from the memory 25 and furnished to the memory lock 22. The setting information contained in the respective word A, B, C, or D then controls the controlled elements 24 and is displayed on the displays in the display section 23.

A write switch 27 and a check switch 28 are associated with the memory device 25 and are also provided (as touch surfaces in FIG. 1), respectively, for entering the contents of the memory lock 22 into the memory device 25 and for checking the contents of the memory device 25 without affecting the contents of the memory lock 22.

Whenever it is desired to change a particular setting, the contents of the memory lock 22 can be changed by touching the appropriate touch surfaces of the setting section 21. Then, the operator can touch the touch surface of the write switch 27 and also touch a desired one of the switches 26A to 26D. In this manner, the setting information entered on the touch switches of the setting section 21 and stored in the memory lock 22 is written into the corresponding memory location 26A to 26D of the memory device 25.

The operator can cause the information stored in the memory device 25 to be transmitted directly to the display section 23 for display therein, without passing through the memory lock 22, by touching his or her finger to the touch surface of the check switch 28.

A setting change display indicator 29 associated with the setting section 21 and the memory lock 22 is provided, for example, as an LED display, on the operating panel 1 of the cassette deck. This setting change display indicator 29 can be caused to turn on or to flicker whenever the contents of the memory lock 22 are altered by operation of the switches of the setting section 21 after setting information stored in the memory device 25 has been transferred therefrom to the memory lock 22. Thus, this setting change display indicator 29 serves as a positive indication to the user that the contents of the memory device 25 have not merely been read out and transmitted to the memory lock 22 for use in controlling the elements 24, but that such information has been partially changed or altered by the user.

Returning to FIG. 1, certain operating functions, such as the tape drive mode of the cassette deck, are controlled directly without use of the memory lock 22. For example, selection of the playback mode, recording mode, rapid-feed (fast-forward) mode, and other tape drive modes are controlled directly by actuation of a playback mode select button 31, recording mode select button 32, rapid-feed mode select button 33, and other similar mode select buttons provided on the operating panel 1 of the cassette deck.

A practical arrangement of the digital control circuitry for the cassette tape deck of this embodiment can be explained in detail with reference to FIGS. 3 and 4.

Figure 3:
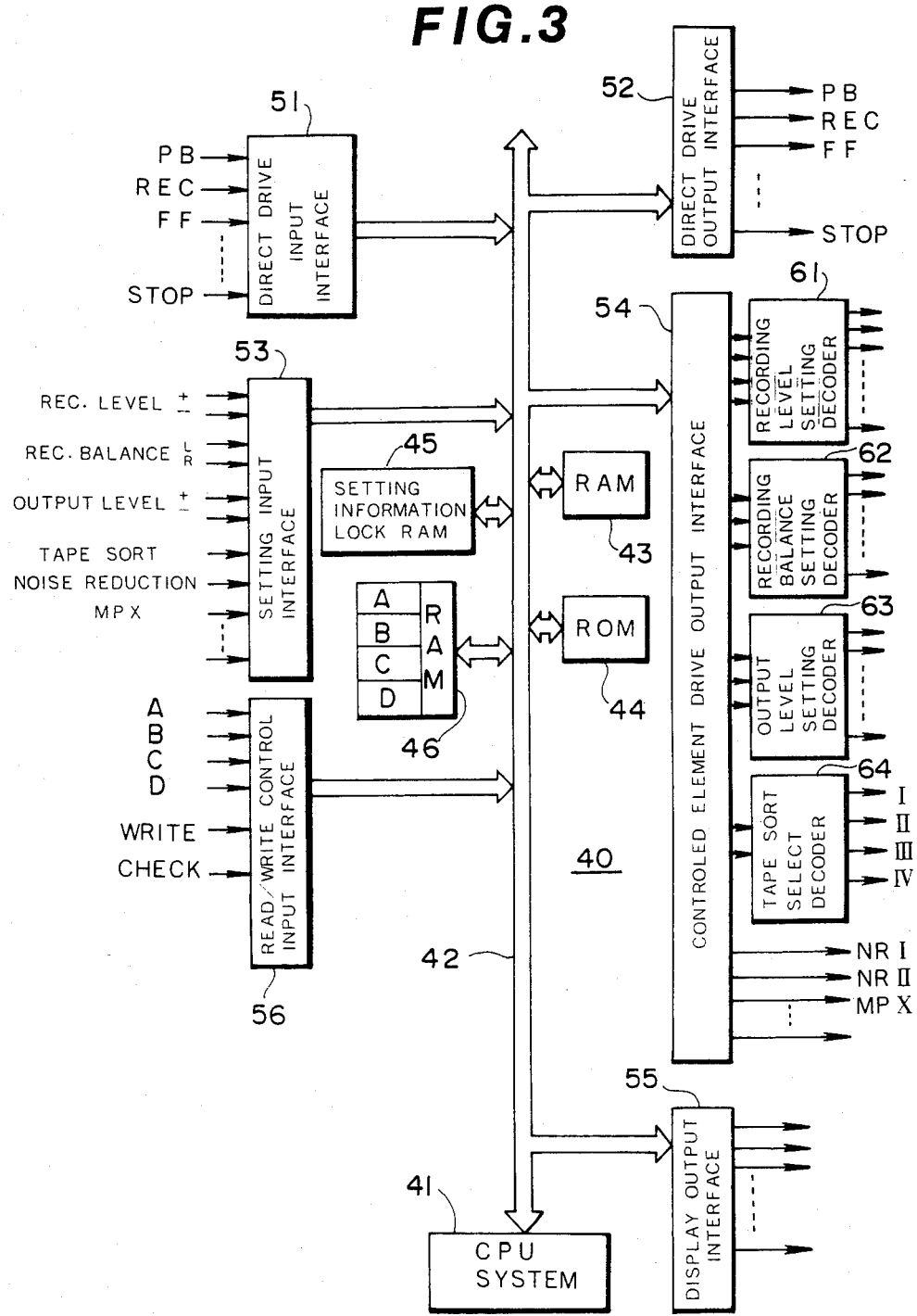
FIG. 3 is a block circuit diagram of a digital signal control arrangement of this embodiment of the invention.

As shown in FIG. 3, the control circuitry can include a microprocessor unit 40 including a central processing unit or CPU 41 and a data bus 42 connecting the latter to other elements and interfaces. A RAM 43 provides operating memory for the CPU 41, while a read-only memory (ROM) 44 stores operating instructions of a fixed operating algorithm and also provides preset data for the microprocessor unit 40. A setting information lock RAM 45 is coupled to the data bus 42 and corresponds to the memory lock 22 of FIG. 2. Another RAM 46 is also coupled to the data bus 42 and serves as the memory device 25 of FIG. 2.

A direct-drive input interface 51 has inputs connected to the mode buttons 31–33 and an output coupled to the data bus 42 of the microprocessor 40 while a corresponding direct drive output interface 52 has an input coupled to the data bus 42 and outputs connected to a tape drive mechanism (not shown) to establish playback, record, fast-forward or rapid-feed, and stop modes of the tape cassette deck.

A setting input interface 53 has inputs connected to the various touch switches within the setting and display area 2 and has an output coupled to the data bus 42 so that information entered on the various touch switches is processed in the CPU 41 and is temporarily stored in the RAM 45, which acts as the memory lock 22. The setting information thus stored in the RAM 45 is furnished to a controlled element drive output interface 54 and to a display output interface 55, which are connected with the data bus 42. A read-write control input interface 56 has inputs connected to the read switches 26A–26D, the write switch 27, and the check switch 28 for supplying read, write, and check commands to the CPU 41. Thus, by actuating the switches 26A to 26D, the contents of the RAM 46 can be transfered to the RAM 45, and by actuation of the write switch 27, the contents of the RAM 45 can be written into the RAM 46. Also, if the check switch 28 is actuated, the contents of the RAM 46 can be transmitted directly to the display output interface 55, but the contents of the RAM 45 remain unchanged.

The setting information stored in the lock memory RAM 45 and supplied to the controlled element drive output interface 54 is converted to a plurality of useful drive signals by means of output decoders including a recording level setting decoder 61, a recording balance setting decoder 62, an output level setting decoder 63, and a tape sort select decoder 64. Other settings, such as the noise reduction selection setting and the multiplex filter setting are simple on/off signals, and can be supplied directly from the interface 54 to the associated controlled elements.

In this arrangement, the CPU 41 operates to process selective reading-out and writing-in of the data words A to D stored in the respective storage locations of the RAM 46 in accordance with the read, write, and check signals supplied to the data bus 42 through the read-write control input interface 56 to effect signal transfer of these words A to D from the RAM 46 to the memory lock RAM 45 or to supply the words A to D from the RAM 46 directly to the display output interface 55 without affecting the contents of the memory lock RAM 45. The CPU 41 also judges whether a change of setting, as indicated by signal supplied from the setting input interface 53, has occurred following signal transfer of one of the data words A to D from the RAM 46 to the memory lock RAM 45, and, if so, furnishes a control signal to the display interface 55 to actuate the setting change display indicator LED 29.

Figure 4:
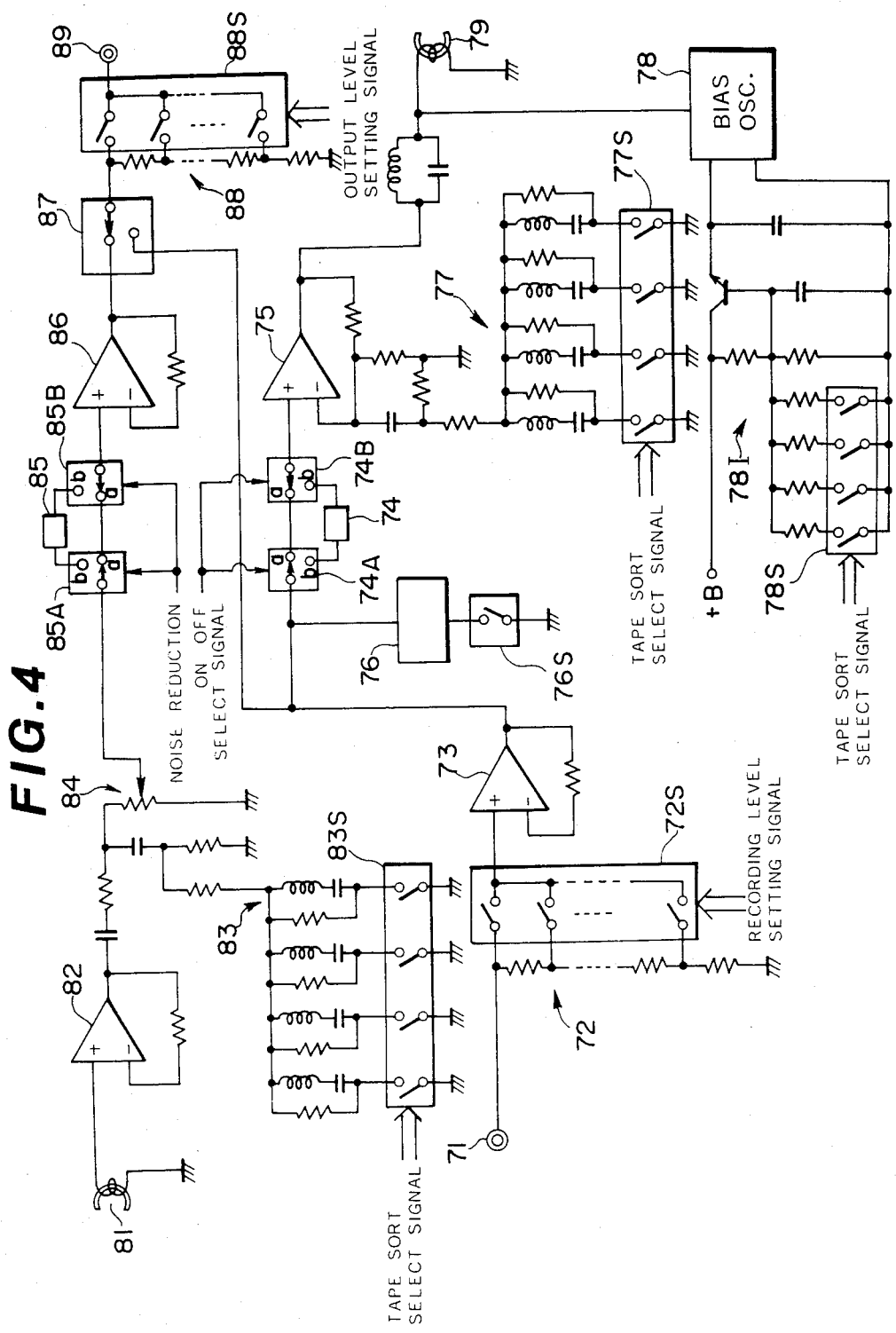
FIG. 4 is a circuit diagram of the audio signal system of this embodiment of the invention.

FIG. 4 shows audio signal processing circuitry for the tape deck according to the embodiment of this invention. For reasons of simplicity, the circuitry for only a single audio channel is shown. However, it is to be understood, that in a stereo or other plural-channel tape deck, like arrangements could easily be provided for each such audio channel.

In FIG. 4, an input terminal 71 receives an input audio signal and supplies the same through a variable damper 72 to an input of a line amplifier 73. Here, the variable damper 72 is formed of a series of resistive elements, and a series of switches 72S is associated therewith. The individual switches in this series of switches 72S can be turned on or off sequentially in accordance with a recording level setting drive signal supplied from the recording level setting decoder 61, so that the signal damping ratio of the variable damper 72 is determined in accordance with the on/off conditions of these switches 72S.

An output of the line amplifier 73 is coupled to a changeover switch 74A which selectively couples the line amplifier 73 to either a noise reduction circuit 74 or another changeover switch 74B. When changeover switches 74A and 74B are in their positions a as shown, the audio signal is provided directly from the line amplifier 73 to a recording amplifer 75. However, if the changeover switches 74A and 74B are switched over to their positions b, the audio signal is furnished from the line amplifier 73 through the noise reduction circuit 74 to the recording amplifier 75.

A multiplex filter 76 is connected at the output terminal of the line amplifier 73 and is selectively actuated by means of a switch 76S. This filter 76 is used for removal of the 19 KHz pilot tone which accompanies multiplex stereo FM broadcasts.

A recording equalizer circuit 77 is connected in a negative feedback path of the recording amplifier 75 and includes a bank of switches 77S each selectively connecting in circuit one of a plurality of equalizing elements of the circuit 77. These switches 77S can be turned on and off in response to tape sort select signals provided from the tape sort select decoder 64 to adjust the recording equalizer characteristic of the amplifier 75 to suit the specifications of the particular type of tape being used.

A bias oscillator 78 provides bias signals which are mixed with the audio output from the recording amplifier 75, and the resulting mixed signal is provided to a recording head 79 for recording the audio signal on tape. This bias oscillator 78 is coupled to a bias current setting level circuit 78I, incorporating a plurality of bias resistors, and to which a series of switches 78S is coupled for controlling the bias level provided to the oscillator 78. These switches 78S are selectively turned on and off in accordance with the tape sort select signal furnished from the decoder 64, thereby selectively coupling one of the bias resistors in circuit to establish the bias level.

A playback head 81 picks up audio signals recorded on the tape and furnishes these audio signals to an input of a preamplifier 82. An output of the preamplifier 82 is coupled to a playback equalizer circuit 83 formed of a plurality of equalizer elements and a series of switches 83S, each of which is coupled to connect one of the equalizer elements in circuit. These switches 83S are controlled by the tape sort select signal furnished from the output decoder 64.

The amplified and equalized playback audio signal is then furnished through a preset resistor 84 to a changeover switch 85A, which is coupled through a noise reduction circuit 85 and another changeover switch 85B to an input of a line amplifier 86. The changeover switches 85A and 85B are coupled so that, in the illustrated positions a, the switches are coupled directly together and the played back audio signal is furnished, without noise reduction, directly to the line amplifier 86; however, when changed over into the position b, the change-over switches channel the played back audio signal through the noise reduction circuit 85 to the line amplifier 86.

The noise reduction changeover switches 74A, 74B, 85A, and 85B are responsive to a single on/off select signal which can be furnished directly from the controlled element drive output interface 54.

A playback/record monitor changeover switch 87 has inputs coupled respectively to the playback line amplifier 86 and the recording line amplifier 73 and has an output connected to a variable signal damper 88. The latter is provided for setting the output level of an output audio signal furnished to an output terminal 89. The variable signal damper 88 in this embodiment is formed of a series of resistors with which there are associated a group of switches 88S that are selectively turned on and off by the output level setting signal furnished from the output level setting decoder 63. This output level setting signal thus controls the total resistance, i.e., signal damping ratio, of the variable signal damper 88.

In the above-described and other possible embodiments of this invention, an electronic appliance or device, such as a cassette tape deck, is capable of storing setting information for a plurality of difference setting configurations. The setting information stored in each of several memory storage locations can be checked while the operator is performing a setting function or operation. On the contrary, it has not been possible in prior-art appliances merely to check the contents of the memory, because such a check would lead unavoidably to a changed setting of controlled elements, such as the equalizing circuit 77 and 83, the variable dampers 72 and 88, the bias levels setting circuit 78I, and the noise reduction circuits 74 and 85. Moreover, in the devices according to the present invention, in contrast to devices of the prior art, once a preset setting state has been established in the latch or memory lock, and the contents of the memory lock have been changed, such change is displayed clearly, for example, on the setting change display indicator 29, to aid the user in preventing an unwanted setting error from occurring.

It is noted that the present invention is not limited to the cassette-tape deck described hereinabove, but may also be practiced in connection with tuners, tape players, record players, amplifiers, or other items of audio equipment. The present invention may also be practiced in connection with video equipment, and with other types of electronic equipment as well.

Further, while a preferred embodiment has been described hereinabove with reference to the drawings, it is to be understood that many modifications and changes can be effected therein without departing from the scope and spirit of this invention, as defined in the appended claims.

We claim:

1. In an electronic appliance of the type in which a plurality of elements are selectively controlled in response to setting information, and including a control panel having setting means on which said setting information is entered, latch means for receiving said setting information from said setting means and setting each of said elements into a setting state as established by said setting information entered on said setting means, and display means mounted on said control panel and coupled to said setting means and operative to display said setting information; the improvement comprising a read switch; a write switch; memory means operative to receive and store the setting information contained in said latch means upon actuation of said write switch and to cause said latch means to receive and store the setting information contained in said memory means upon actuation of said read switch after operation of said write switch; check switch means coupled to said memory means for causing the contents of the latter to be selectively displayed on said display means; and setting-change display means ssociated with said display means and said setting means for indicating that the setting information for at least one of said element has been altered by an entry of new setting information on said setting means after said setting information has been read out from said memory means and received in said latch means.

2. An electronic appliance according to claim 1, wherein said memory means includes a plurality of addressable storage locations, each corresponding to an associated group of settings for said plurality of elements to establish respective preset setting configurations of said elements.

3. An electronic appliance according to claim 1, wherein said display means includes a plurality of display devices, each of said display devices corresponding to a respective one of said plurality of elements.

4. An electronic appliance according to claim 1, further comprising additional controlled elements; additional setting means for selectively entering additional setting information to control said additional controlled elements; and interface means coupling said additional elements and the associated additional setting means directly without supplying said additional setting information to said latch means.

5. An electronic appliance according to claim 1, wherein said appliance includes a microprocessor element for operating said memory means and for actuating said setting-change display means, said microprocessor element including a central processing unit, a ROM containing control information for operating said central processing unit, a first RAM included in said latch means, a second RAM, included in said memory means, input interface means coupled to said read switch, said write switch, said check switch, and said setting means, output interface means coupled to drive said display means and each of said plurality of elements, and data bus means coupling said central processing unit, said ROM, said first RAM, said second RAM, said input interface means, and said output interface means.

6. In an electronically-controlled cassette tape deck of the type in which recording level selection, recording balance, noise reduction selection, tape type selection, and output level selection are controlled in response to setting information, and including a control panel having setting switches thereon for entering said setting information for said recording level selection, said recording balance, said noise reduction selection, said tape type selection, and said output level selection, and having display arrangements mounted thereon associated with said recording level selection, said recording balance, said noise reduction selection, said tape type selection, and said output level selection, control elements for controlling said recording level selection, said recording balance, said noise reduction selection, said tape type selection, and said output level selection, respectively, and latch means coupled to receive said setting information from said setting switches and to supply the associated control elements with said setting information for setting each of said control elements into a setting state as established by said setting switches; the improvement comprising a plurality of read switches; a write switch; memory means operative to receive and store the setting information contained in said latch means upon actuation of said write switch and to cause said latch means to receive and store the setting information contained in said memory means and associated with said control elements upon actuation of one of said read switches; check switch means coupled to said memory means for causing the contents of the latter to be selectively displayed on the associated display arrangement; and setting-change display means associated with said setting switches for indicating that the information for setting said control elements has been altered by an entry of new setting information with said setting switches after said information has been read out from said memory means and received in said latch means.

7. Electronically-controlled cassette tape deck according to claim 6, wherein said check switch means is operative to cause the information stored in said memory means to be displayed on the display arrangement without being supplied to said latch means.

8. Electronically-controlled cassette tape deck according to claim 6, wherein said tape deck includes a microprocessor element for operating said memory means and for actuating said setting-change display means, said microprocessor element including a central processing unit, a ROM containing control information for operating said central processing unit, a first RAM included in said latch means, a second RAM included in said memory means, input interface means coupled to said read switches, said write switch, said check switch, and said setting switches, output interface means coupled to drive said display arrangements and to supply said information to each of said control elements, and data bus means coupling said central processing unit, said ROM, said first RAM, said second RAM, said input interface means, and said output interface means.

9. Electronically-controlled cassette tape deck according to claim 6, wherein the control element associated with said tape type selection includes an equalizer circuit having a plurality of equalizer elements and switch device means selectively coupling one of said equalizer elements in circuit in response to the value of the associated setting information.

10. Electronically-controlled cassette tape deck according to claim 9, wherein said control element associated with said tape type selection includes a bias level setting circuit having a plurality of bias elements and second switch device means selectively coupling one of said bias elements in circuit in response to the value of the associated setting information.

11. Electronically-controlled cassette tape deck according to claim 6, wherein said memory means includes a plurality of storage locations, each associated with a corresponding one of said plurality of read switches and each adapted to store a data word containing preset information for each of said control elements.

* * * * *